United States Patent [19]

Kasama et al.

[11] Patent Number: 4,746,594

[45] Date of Patent: May 24, 1988

[54] SILVER HALIDE PHOTOGRAPHIC MATERIAL FOR PHOTOMECHANICAL PROCESS AND REDUCTIVE PROCESSING METHOD USING THE SAME

[75] Inventors: Yasuo Kasama; Inoue Nobuaki; Ken-ichi Kuwabara, all of Kanagawa, Japan

[73] Assignee: Fuji Photo Film Co., Ltd., Kanagawa, Japan

[21] Appl. No.: 21,570

[22] Filed: Mar. 2, 1987

Related U.S. Application Data

[63] Continuation of Ser. No. 800,101, Nov. 22, 1985, abandoned, which is a continuation of Ser. No. 573,176, Jan. 23, 1984, abandoned.

[30] Foreign Application Priority Data

Jan. 24, 1983 [JP] Japan ................................ 58-9612

[51] Int. Cl.[4] .......................... G03C 1/02; G03C 5/42
[52] U.S. Cl. .................................... 430/264; 430/265; 430/949; 430/961; 430/639; 430/631; 430/642
[58] Field of Search ............... 430/264, 265, 949, 309, 430/639, 961, 631, 642, 523, 539, 622, 621

[56] References Cited

U.S. PATENT DOCUMENTS

| | | | |
|---|---|---|---|
| 3,105,762 | 10/1963 | Byrne et al. | 430/961 |
| 3,222,177 | 12/1965 | Lemmerling | 430/523 |
| 3,253,926 | 5/1966 | Van Pee et al. | 430/639 |
| 4,367,284 | 1/1983 | Cellone et al. | 430/961 |
| 4,450,230 | 5/1984 | Delfino et al. | 430/961 |
| 4,455,365 | 6/1984 | Urata et al. | 430/302 |
| 4,460,680 | 7/1984 | Ogawa et al. | 430/961 |

FOREIGN PATENT DOCUMENTS

| | | |
|---|---|---|
| 112659 | 7/1984 | European Pat. Off. . |
| 2101758 | 1/1983 | United Kingdom . |
| 2110400 | 6/1983 | United Kingdom . |

OTHER PUBLICATIONS

Research Disclosure, vol. 176, Dec. 1978, pp. 22-31, Disclosure #17643.

*Primary Examiner*—Won H. Louie
*Attorney, Agent, or Firm*—Sughrue, Mion, Zinn, Macpeak and Seas

[57] ABSTRACT

A silver halide photographic material for a photomechanical process is disclosed. The material comprises a support having provided thereon at least one light-sensitive silver halide emulsion layer and at least one light-insensitive upper layer disposed on the upper side of the emulsion layer. The light-sensitive upper layer has a greater melting time than the light-sensitive emulsion layer. The emulsion layer contains starch, modified starch and/or macromolecular polysaccharides produced from starch using a microbial fermentation process. The material has greatly improved reduction processability.

20 Claims, No Drawings

4,746,594

SILVER HALIDE PHOTOGRAPHIC MATERIAL FOR PHOTOMECHANICAL PROCESS AND REDUCTIVE PROCESSING METHOD USING THE SAME this is a continuation of application Ser. No. 800,101, filed Nov. 22, 1985, abandoned, which is a continuation of Ser. No. 573,176, filed Jan. 23, 1984, abandoned.

FIELD OF THE INVENTION

The present invention relates to a silver halide photosensitive graphic art film i.e., a silver halide photographic material to make an original transparency which is used for making a printing plate by employing a photomechanical process and, more particularly, to a photosensitive material to make an original transparency which has markedly high reduction processability and further, to a method for reduction processing in which the sensitive material having a very great aptitude for reduction processing is employed.

BACKGROUND OF THE INVENTION

In the graphic arts industries and the like, a photosensitive material to make an original transparency signify photosensitive materials which are used for converting continuous-tone images of originals into half-tone images or for photographing line originals or the like, which is involved in a photomechanical process.

In the usual production of printing plates utilizing such photosensitive materials as described above, partial or overall minute retouch of image is carried out. This is done with the intention of reproducing the delicate tones of originals so that they have excellent printing characteristics or satisfying the artistic expression of the printed image. This is frequently carried out by subjecting these materials to a processing referred to as a reduction processing. This involves reducing the dot area of half-tone images, or increasing or decreasing the width of line images, or so on.

Accordingly, whether or not the photosensitive material have an aptitude for a reduction processing has become very important of such materials.

Reduction processing of the photosensitive material having dot images of line images formed through exposure and subsequent development steps is achieved by bringing metallic silver, by which the dot or line images are formed, into contact with a reducing solution. Various kinds of reducing solutions are known, specific examples include those containing as a reducing component a permanganate, a ferric salt, a ceric salt, a hexacyanoferrate (III), a dichromate, a persulfate or so on are described in, for example, C. E. K. Mees, *The Theory of the Photographic Process*, pp. 783–739, Macmillan, New York (1954).

However, since the reduction processing consists in, in the ultimate analysis, oxidation of a silver image and dissolution of the resulting oxidized silver, a decrease in dot area of a half-tone image due to the reduction processing is accompanied with a decrease in dot density. Therefore, the range of the retouching possibilities with reduction processing is reduced depending on the degree of the decrease in per dot density which the reduction processing causes along with the decrease in dot area. That is to say, a measure of the range of the retouching possibility relating to a half-tone image can be represented by the greatest possible extent that a dot area of the half-tone image can be reduced to as the per dot density is kept at some definite value or above.

In this specification, the magnitude of decrease of the dot area after receiving the reduction processing compared to the dot area before receiving the processing, when the dot density is reduced by the processing to the lowest possible value that the dot density must have in the photomechanical process, is expressed in terms of "reduction width". One aptitude for reduction processing increases as the reduction width increases.

As an example of a technique for enhancing the aptitude for reduction processing, there has been known the method described in published unexamined Japanese Patent Application No. 68419/77 wherein the reduction processing is carried out in the presence of specified mercapto compounds. However, such a method requires the use of special reducing solutions, which are difficult to use due to differences in reduction speed and so on from conventionally used ones.

The covering power of a gelatin-silver halide emulsion can be increased by adding thereto a natural or a synthetic macromolecular compound other than gelatin, such as poly-N-vinyllactams, starch, dextrin, laminarin, mannanhydroxyethylated cellulose, or the like. This is disclosed in, for example, U.S. Pat. Nos. 3,058,826 and 3,003,878; French Pat. No. 1,261,846; Belgian Pat. Nos. 611,622 and 611,623. Although it is possible to extend the reduction width through enhancement of the covering power attained in the above-described manner, the emulsion film becomes too soft. Thus the film can not obtain the mechanical strength necessary if the above-described additives having high molecular weights are used in such amounts as to improve upon the covering power.

The most effective measure for improving upon the aptitude for reduction processing through expansion of the reduction width is increasing the amount of silver to be used for the formation of image. This is because the reduction processing, as described hereinbefore, consists in dissolution of silver image through oxidation thereof. Therefore, the possibility of effecting retouching of the image by reduction processing generally increases along with the per unit area amount of image-forming silver.

Accordingly, the reduction width becomes wider as the per unit area coverage of silver halide used in the process photosensitive material is increased. However, as is universally known, silver is a very expensive and precious metal and therefore, an increase in the coverage of silver is undesirable with respect to saving money and resources.

Accordingly, production of a photosensitive material to make an original transparency having the desired characteristics with the use of the least possible amount of silver has been an important subject in this art.

SUMMARY OF THE INVENTION

A primary object of the present invention is, therefore, to provide a photosensitive material to make an original transparency having an aptitude for reduction processing which is improved without increasing the amount of silver coverage.

Another object of the present invention is to provide a reductive processing method excellent in the reduction width with such a photosensitive material to make an original transparency.

The present inventors found that if a hardening technique capable of controlling the hardening degree of a light-insensitive upper layer and that of a silver halide emulsion layer independently (independent hardening technique of coated films) is applied and the hardening degree of the light-insensitive upper layer is made greater than that of the silver halide emulsion layer, the reduction width can be extended and therethrough, the aptitude for reduction processing can be markedly improved. This finding is described in Japanese Patent Application No. 140669/81, corresponding to GB No. 2108695A. As the result of further studies on the above-described subject, the present inventors have now found that the aptitude for the reduction processing is further heightened by adding starch, modified starch and/or macromolecular polysaccharides produced from starch using a microbial fermentation process to the light-sensitive silver halide emulsion layer of a photosensitive material to make an original transparency whose reduction width is to be extended in the above-described manner.

That is, the present invention comprises a phototosensitive material to rake an original transparency, which has on a support at least one light-sensitive silver halide emulsion layer and at least one light-insensitive upper layer provided on the upper side of said emulsion layer, with at least one of the light-insensitive upper layers having a melting time longer than those of the light-sensitive silver halide emulsion layers. The emulsion layer containing starch, modified starch and/or macro-molecular polysaccharides is produced from starch using a microbial fermentation process. The present invention also includes a reductive processing method in which the above-described photosensitive material is subjected to reduction processing after exposure and subsequent development processings.

With the present invention there is no deterioration of the film strength even if starch, modified starch or macromolecular polysaccharides produced from starch using a microbial fermentation process are added to the emulsion layer in a considerable amount. This result is possible only when the melting time of the light-insensitive upper layer is made longer than that of the emulsion layer using the above-described hardening technique, as in the present invention.

Moreover, the photosensitive material of the present invention comes to have an increased reduction width to such an extent as to exceed expectations based on the effect of starch, modified starch or macromolecular polysaccharides produced from starch using a microbial fermentation process upon the increase in covering power. Such an effect of the present invention cannot be obtained by the addition of other macromolecular additives, (such as poly-N-vinyllactams, poly-N-vinylpyrrolidone, cellulose derivatives, etc.), but results from the characteristic of starch, modified starch, or macromolecular polysaccharides produced from starch using a microbial fermentation process.

In addition, the present invention has a peculiar effect that a screen range (halftone gradation) is elongated with halftone photography. This effect would also be unforeseen by one skilled in the art.

DETAILED DESCRIPTION OF THE INVENTION

Starch to be employed in the present invention is not subject to any particular restrictions. Useful examples of starch include those of various origins, such as corn starch, potato starch, sweet potato starch, wheat starch, rice starch, tapioca starch, sago starch and so on. Examples of modified starch which can be used in the present invention include starch derivatives, hydrolysis products of starch, and derivatives of hydrolysis products of starch. Specific examples of the starch derivatives include starch acetate, carboxymethyl starch, hydroxyalkylated starch, starch phosphate, cationic starch, alkyl starch ether and so on. The hydrolysis products of starch mean those obtained by severing molecular chains of starch by the use of an enzyme, an acid, an alkali and/or heat or the like to reduce its molecular weight, with the specific examples including thinly-made starch paste, white dextrin, British gum, soluble starch and so on. The derivatives of hydrolysis products of starch include those obtained by hydrolyzing the above-described derivatives of starch, and those obtained by converting the above-described hydrolysis products of starch into their derivatives through various treatments such as hydroxyalkyletherification, carboxymethylation, acetylation, etc. Among these modified starches, hydroxyalkylated, (especially hydroxyethylated or hydroxypropylated) starches, their hydrolysis products, and those obtained by hydroxyalkyl, (expecially hydroxyethyl or hydroxypropyl) etherifying hydrolysis products of starch are particularly desirable for the present invention. For details of these starches and modified starches, Jiro Nikuni (editor), *Denpun Kagaku Handbook* (Handbook of Starch Science), Asakura Shoten, Tokyo (1977); R. W. Kerr, *Chemistry and Industry of Starch*, 2nd ed., Academic Press Inc., New York (1950); J. A. Radley, *Starch and Its Derivatives*, vol. I & II, 3rd ed., Chapman & Hall Ltd., London (1953); and so on can be referred to.

Suitable examples of macromolecular polysaccharides produced from starch using a microbial fermentation process include noncrystalline, water soluble ones, such as dextran which is a macromolecular saccharide wherein glucose molecules are linked to one another by α-1,6 bonding; Pullulan (trade name, produced by Sumitomo Chemical Co., Ltd.) which is a macromolecular polysaccharide wherein maltotriose molecules, that is, trimer of glucose, are linked to one another by α-1,6 bonding; and so on.

The additive such as starch, modified starch and macromolecular polysaccharide produced from starch using a microbial fermentation process is empolyed in a proportion of 0.01 to 1 part by weight, preferably 0.1 to 0.6 part by weight, to a hydrophilic colloidal binder, (especially gelatin) used in the light-sensitive silver halide emulsion layer, that is, at a coverage of 0.01 to 3.0 $g/m^2$, particularly preferably 0.05 to 1.0 $g/m^2$.

The light-insensitive upper layer of the present invention is a layer made up substantially of a hydrophilic colloid and provided over the whole upper surface of a light-sensitive silver halide emulsion layer. As for such a light-insensitive upper layer, only one layer may be provided, or two or more layers may be provided depending on circumstances.

The expression "a melting time of at least one of the light-insensitive upper layers is greater than that of the emulsion layer" in the present invention means that said light-insensitive upper layer is hardened more strongly than the emulsion layer.

Several methods for evaluating the degree of hardening attained in the layer having received a hardening treatment are well-known in the art. Examples of preferred methods include a method using a degree of swelling which the hardened layer shows in a certain solution, a method using a scratching strength which is expressed in terms of the weight of the load which is applied to needle-shape styrus when scratches are firstly generated on the hardened layer, or so on. A method using a melting time (MT) at which the hardened layer soaked in a certain solution at a definite temperature starts melting is the most effective for the present invention. More specifically, the measurement of the melting time is carried out to greatest advantage in 0.2N NaOH solution kept at 75° C. (However, the present invention is not necessarily limited to this condition.)

In the present invention, a measure to be taken for the purpose of making a melting time of at least one light-insensitive upper layer greater than those of light-sensitive silver halide emulsion layers consists in hardening selectively said light-insensitive upper layer alone to a greater degree, compared with the light-sensitive silver halide emulsion layers, using an independent hardening technique of coated films. Therein, it is desirable to conduct the selective hardening under such a condition that a melting time of at least one light-insensitive upper layer may become greater than those of silver halide emulsion layers by 50 seconds or more, especially 100 seconds or more, based on the above-described method of measurement.

Such selective hardening of at least one light-insensitive upper layer may be achieved by using a method as described in, for example, published examined Japanese Patent Application No. 17112/67, corresponding to GB No. 1049083 wherein gelatin to be employed as the major binder of the light-insensitive upper layer is reacted with a diffusible low molecular hardener prior to coating to such an extent as not to affect adversely its coating facility, and the resulting gelatin is used for coating. Further, it is also feasible to employ polymers having functional groups capable of being cross-linked to gelatin through a hardener, as described in U.S. Pat. No. 4,207,109. Furthermore, polymers having functional groups capable of reacting with gelatin (polymeric hardener) which are well known in, for example, published unexamined Japanese Patent Application No. 66841/81; British Pat. No. 1,322,971; U.S. Pat. No. 3,671,256; D. M. Burness and J. Pouradier, *The Theory of the Photographic Process*, 4th ed. (T. H. James ed.), pp. 84, Macmillan, New York (1977); G. A. Campbell, L. R. Hamilton and I. S. Ponticello, *Polymeric Amine and Ammonium Salts*, (E. J. Goetnals ed.), pp. 321–332, Pergamon Press, New York (1979); and so on are favorable for attaining the object of the present invention because of their nondiffusibilities attributable to their high molecular weights.

Preferable examples of such polymeric hardeners include those which have the following general formula (I), (II) or (III). Among these polymeric hardeners, those having the general formula (I) are particularly advantageous.

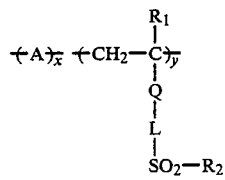

wherein A represents an ethylenic unsaturated monomer capable of copolymerizing with the monomer unit shown on its right side; $R_1$ represents a hydrogen atom or a lower alkyl group containing 1 to 6 carbon atoms; Q represents —$CO_2$—,

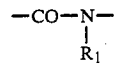

(where $R_1$ has the same meaning as described above) or an arylene group containing 6 to 10 carbon atoms; L represents a divalent group having 3 to 15 carbon atoms and that, containing at least either —$CO_2$— or

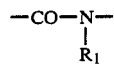

(where $R_1$ has the same meaning as described above), or a divalent group having 1 to 12 carbon atoms and that, containing at least one bonding selected from a class consisting of —O—,

—CO—, —SO—, —$SO_2$—, —$SO_3$—,

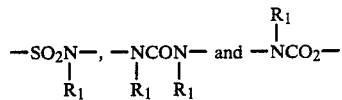

(where $R_1$ has the same meaning as described above); $R_2$ represents a vinyl group or a functional group corresponding to the precursor thereof, which have the formulae —CH=$CH_2$ and —$CH_2CH_2X$, respectively, (wherein X represents a group capable of being replaced by a nucleophilic group, or a group capable of being released by a base in a form of HX); and x and y each represents a mole % fraction, and x ranges from 0 to 99 and y ranges from 1 to 100.

Specific examples of an ethylenic unsaturated monomer represented by A in the formula (I) include ethylene, propylene, 1-butene, isobutene, styrene, chloromethylstyrene, hydroxymethylstyrene, sodium vinylbenzenesulfonate, sodium vinylbenzylsulfonate, N,N,N-trimethyl-N-vinylbenzylammonium chloride, N,N-dimethyl-N-benzyl-N-vinylbenzylammonium chloride, α-methylstyrene, vinyltoluene, 4-vinylpyridine, 2-vinylpyridine, benzylvinylpyridinium chloride, N-vinylacetoamide, N-vinylpyrrolidone, 1-vinyl-2-methylimidazole, monoethylenic unsaturated esters of aliphatic acids, such as vinyl acetate, acryl acetate, etc., ethylenic unsaturated mono- or di-carboxylic acids and the salts thereof, such as acrylic acid, methacrylic acid, itaconic acid, maleic acid, sodium arylate, potassium acrylate, sodium methacrylate, etc., maleic anhydride, ethylenic unsaturated mono- and di-carboxylic acid esters, such as n-butylacrylate, n-hexylacrylate, hydroxyethylacrylate, cyanoethylacrylate, N,N-diethylaminoethylacrylate, methylmethacrylate, n-butylmethacrylate, benzylmethacrylate, hydroxyethylmethacrylate, chloroethylmethacrylate, methoxyethylmethacrylate, N,N-diethylaminoethylmethacrylate, N,N,N-triethyl-N-methacryloyloxyethylammonium p-toluenesulfonate, N,N-diethyl-N-methyl-N-methacryloyloxyethylammonium p-toluenesulfonate, dimethyl itaconate, monobenzylmaleate, etc.), ethylenic unsaturated mono- and di-carboxylic acid amides (such as acrylamide, N,N-dimethylacrylamide, N-methylolacrylamide, N-(N,N-dimethylaminopropyl)acrylamide, N,N,N-trimethyl-N-(N-acryloylpropyl)ammonium p-toluenesulfonate, sodium 2-acrylamido-2-methylpropanesulfonate, acryloylmorpholine, methacrylamide, N,N-dimethyl-N'-acryloylpropanediaminepropionate betaine, N,N-dimethyl-N'-methacryloylpropanediamineacetate betaine, etc.) and so on.

On the occasion that the polymer of the present invention is used in a state of cross-linked latex, monomers containing two or more of copolymerizable ethylenic unsaturated groups (e.g., divinylbenzene, methylenebisacrylamide, ethylene glycol diacrylate, trimethylene glycol diacrylate, ethylene glycol dimethacrylate, trimethylene glycol dimethacrylate, neopentylglycol dimethacrylate, etc.) can be employed as the monomer A in addition to the ethylenic unsaturated monomers set forth above.

Suitable examples of the substituent $R_1$ in the formula (I) include methyl group, ethyl group, butyl group and n-hexyl group.

Suitable examples of the divalent group Q include —$CO_2$—, —CONH—,

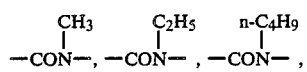

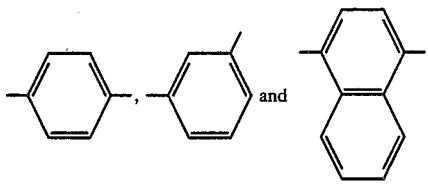

Suitable examples of the divalent group L include —$CH_2CO_2CH_2$—, —$CH_2CO_2CH_2CH_2$—, —$CH_2CH_2CO_2CH_2CH_2$—, —$(CH_2)_5$—$CO_2$—$CH_2CH_2$—, —$(CH_2)_{10}CO_2CH_2CH_2$—, —$CH_2NHCOCH_2$—, —$CH_2NHCOCH_2CH_2$—, —$(CH_2)_3NHCOCH_2CH_2$—, —$(CH_2)_5NHCOCH_2CH_2$—, —$(CH_2)_{10}NHCOCH_2CH_2$—, —$CH_2OCH_2$—, —$CH_2CH_2OCH_2CH_2CH_2$—,

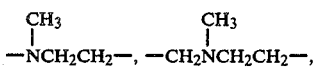

—$COCH_2CH_2$—, —$CH_2COCH_2CH_2$—,

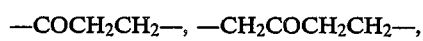

—$SOCH_2CH_2$—, —$CH_2SOCH_2CH_2$—, —$SO_2CH_2CH_2$—, —$SO_2CH_2CH_2SO_2CH_2CH_2$—,

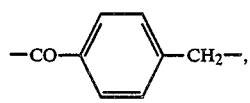

—$NHCONHCH_2CH_2CH_2$—, —$CH_2NHCONHCH_2C$-$H_2$—, —$NHCO_2CH_2CH_2$—, and —$CH_2NHCO_2CH_2CH_2$—.

Suitable examples of the substituent $R_2$ in the formula (I) include —CH=$CH_2$, —$CH_2CH_2Cl$, —$CH_2CH_2Br$, —$CH_2CH_2O_3SCH_3$,

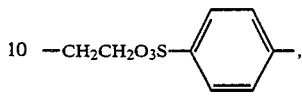

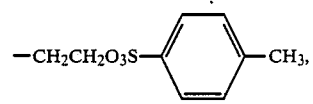

—$CH_2CH_2OH$, —$CH_2CH_2O_2CCH_3$, —$CH_2C$-$H_2O_2CCF_3$ and —$CH_2CH_2O_2CCHCl_2$.

Preferable polymeric hardeners belonging to another class are those described in U.S. Pat. No. 4,161,407; and they have a repeating unit represented by the following formula (II):

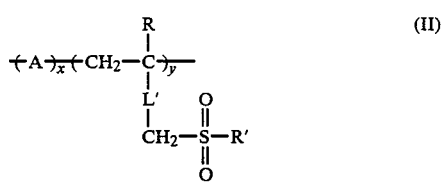

wherein A represents an ethylenic unsaturated monomer unit capable of undergoing copolymerization with the monomer unit shown on the right side thereof, or a mixture of such monomers; x and y each represents a mole fraction, and x ranges from 10 to 95% and y ranges from 5 to 90%; R represents a hydrogen atom, or an alkyl group containing 1 to 6 carbon atoms; R' represents —CH=$CH_2$, or —$CH_2CH_2X$, (wherein X represents a group capable of being replaced by a nucleophilic group, or a group capable of being released by a base in a form of HX); and L' represents a linking group selected from alkylene groups, (especially those containing 1 to 6 carbon atoms such as methylene, ethylene, isobutylene and the like), arylene groups containing 6 to 12 carbon atoms (e.g., phenylene, tolylene, naphthaline, etc.), —COZ— or —$COZR_3$—, (wherein $R_3$ represents an alkylene containing 1 to 6 carbon atoms, or an arylene containing 6 to 12 carbon atoms; and Z represents an oxygen atom or —NH).

Suitable examples of A in the formula (II) include the same monomers as those represented by A in the formula (I). Suitable examples of R in the formula (II) include the same substituents as those represented by $R_1$ in the formula (I). Suitable examples of R' in the formula (II) include the same substituents as those represented by $R_2$ in the formula (I).

Preferable polymeric hardeners belonging to still another class are those described in British Pat. No. 1,534,455; and they have a repeating unit represented by the following formula (III):

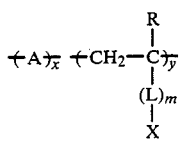 (III)

wherein A represents an ethylenic unsaturated monomer unit capable of copolymerizing with the monomer unit shown on the right side thereof; R represents a hydrogen atom, or an alkyl group containing 1 to 6 carbon atoms; L represents a divalent linking group containing 1 to 20 carbon atoms, (preferably a divalent group containing 1 to 12 carbon atoms and that, having at least either —CONH— or —CO—); X represents an active ester group; x and y each represents a mole % fraction, and x ranges from 0 to 95 and y ranges from 5 to 100; and m is 0 or 1.

Suitable examples of A in the formula (III) include the same monomers as those represented by A in the formula (I).

Suitable examples of R in the formula (III) include the same substituents as those for $R_1$ in the formula (I), which are described hereinbefore.

Suitable examples of L in the formula (III) include —CONHCH$_2$—, —CONHCH$_2$CH$_2$—, —CONHCH$_2$CH$_2$CH$_2$—, —CONHCH$_2$CH$_2$CH$_2$CH$_2$CH$_2$—, —COCH$_2$CH$_2$OCOCH$_2$CH$_2$—, —CONHCH$_2$CONHCH$_2$—, —CONHCH$_2$CONHCH$_2$CONHCH$_2$—, —COCH$_2$—, —CONHCH$_2$NHCOCH$_2$CH$_2$SCH$_2$CH$_2$—, —CONHCH$_2$OCOCH$_2$CH$_2$—, and so on.

Suitable examples of X in the formula (III) include

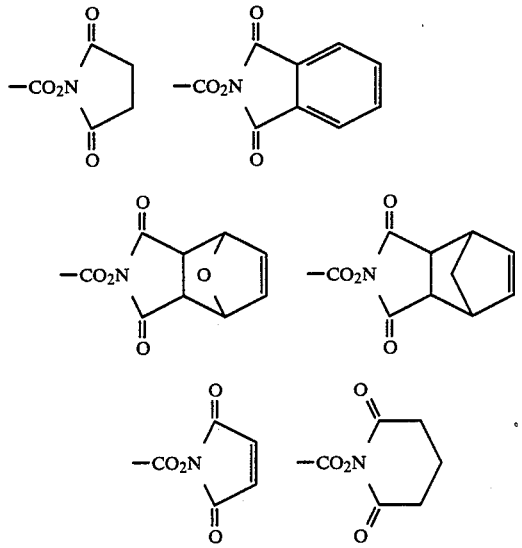

-continued

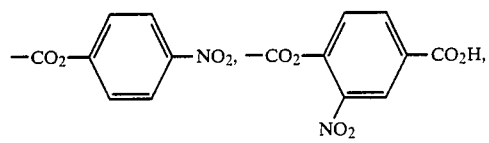

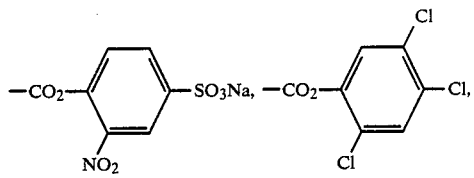

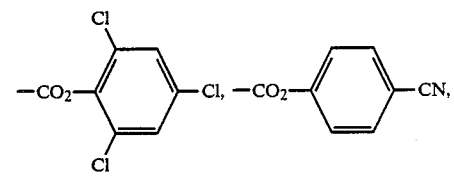

—CO$_2$CH$_2$CN, —CO$_2$CH$_2$CO$_2$C$_2$H$_5$, —CO$_2$CH$_2$CONH$_2$, —CO$_2$CH$_2$COCH$_3$,

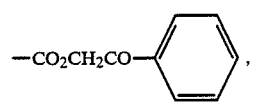,

—CO$_2$CH$_2$CO$_2$CH=CH$_2$, —CO$_2$N=CHCH$_3$, —CO$_2$N=C(CH$_3$)$_2$,

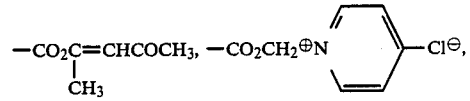

—CO$_2$CH$_2$CH$_2$Br, —CO$_2$CH$_2$CH$_2$CN,

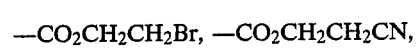

and so on.

Specific examples of polymeric hardeners which can be used to advantage in the present invention will now be illustrated below. However, the present invention should not be construed as being limited to these examples.

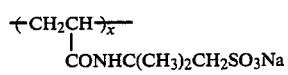  P-1 x/y = 3/1

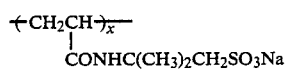  P-2 x/y = 3/1

-continued

 P-3

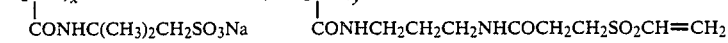

x/y = 3/1

 P-4

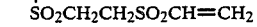

x/y = 3/1

 P-5

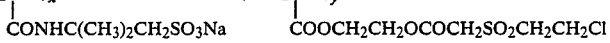

x/y = 3/1

 P-6 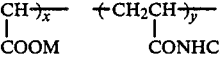 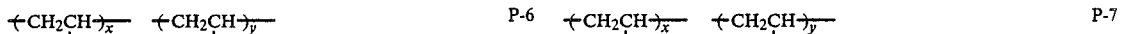 P-7

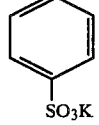

x/y = 3/1   x/y = 10/1

 P-8  P-9

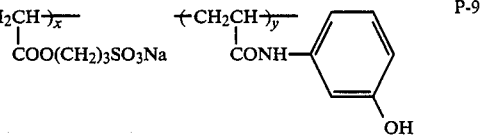

x/y = 10/1   x/y = 3/1

 P-10   P-11

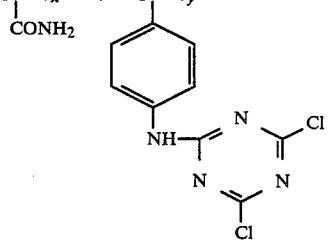

x/y = 20/1   x/y = 5/1

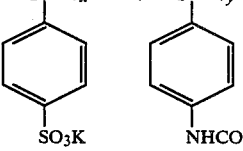 P-12  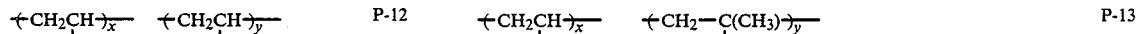 P-13 x/y = 10/1   x/y = 5/1

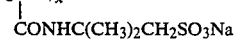 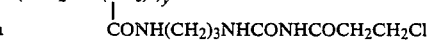 P-14

x/y = 10/1

In the foregoing structural formulae, M represents a hydrogen atom, a sodium atom, or a potassium atom, and x and y are prepared amounts of their respective repeating units, which are expressed in terms of mole % fraction, and ranges specifically from 0 to 99 and 1 to 100, respectively.

These polymeric hardeners to be used in the present invention can be synthesized using methods as described in Japanese Patent Application No. 142464/82 corresponding to U.S. Ser. No. 524,001 and so on.

The amount of the polymeric hardener to be used ranges from 5 mg to 500 mg, preferably 10 mg to 250 mg per square meter of the photosensitive material.

In hardening the light-insensitive upper layer, the above-described polymeric hardeners may be used independently, or in combination with a diffusible lower molecular weight hardener. In the latter case, although the low molecular weight hardener diffuses into emulsion layers and hardens them, selective hardening becomes feasible since the light-insensitive upper layer contains both the low molecular weight hardener and a nondiffusible polymeric hardener. Suitable examples of these diffusible low molecular weight hardeners include various kinds of organic or inorganic hardeners (which may be used independently or in combination of two or more thereof). Representatives of such hardeners are aldehyde series compounds such as mucochloric acid, formaldehyde, trimethylolmelamine, glyoxal, 2,3-dihydroxy-1,4-dioxane, 2,3-dihydroxy-5-methyl-1,4-dioxane, succinaldehyde glutaraldehyde and the like; active vinyl compounds such as divinyl sulfone, methylenebismaleimide, 1,3,5-triacryloyl-hexahydro-s-triazine, 1,3,5-trivinylsulfonyl-hexahydro-s-triazine, bis(vinylsulfonylmethyl) ether, 1,3-bis(vinylsulfonyl)-propanol-2, bis($\alpha$-vinylsulfonylacetamido)ethane, 1,2-bis(vinylsulfonyl)ethane, 1,1'-bis(vinylsulfonyl)methane and the like; active halogen compounds such as 2,4, dichloro-6-hydroxy-s-triazine and the like; ethyleneimine series compounds such as 2,4,6-triethyleneimino-s-triazine and the like; and so on, which are well-known as gelatin hardeners in the art.

The polymeric hardener is dissolved in water or an organic solvent, and added directly to the layer whose hardening degree is intended to be controlled. On the occasion that a diffusible hardener is used in combination with the polymeric hardener, it may be added to the same light-insensitive upper layer as one which the polymeric hardener is added to, or may be added to a light-insensitive upper layer different from one which the polymeric hardener is added to and allowed to diffuse into the whole light-insensitive upper layers. An addition amount of the nondiffusible polymeric hardener is determined normalizing the content of reactive groups in the hardener.

Another method for controlling hardening degrees of coated films separately consists in the control of diffusibility of the low molecular weight hardener used through the control of the way of adding the hardener and the condition of drying the coated films. For example, hardening degrees of coated films can be controlled independently in such a manner that a low molecular weight hardener having a vinyl sulfone group is added to an only coating composition for a surface protective layer, the resulting coating composition and silver halide emulsions are coated in individual layers using a multilayer simultaneous coating process and then, subjected to rapid drying.

In the above-described manner, at least one light-insensitive upper layer is selectively hardened so as to have a melting time greater than those of light-sensitive silver halide emulsion layers and thereby, it becomes feasible to impart anisotropy to the rate at which a reducing solution oxidizes and dissolves silver image. That is, as at least one light-insensitive upper layer is hardened to a greater degree than the light-sensitive silver halide emulsion layer in which silver image is formed, a reducing solution can attack silver image more readily in such a direction as to bring about the reduction of image area of the silver image (in the direction palallel to the plane of the emulsion layer) rather than in such a direction as to cause the lowering of image density of silver image (in the direction perpendicular to the plane of the silver image).

The term a photosensitive material of the present invention refers to the photosensitive material employed for printing halftone images and line images using the photomechanical process in the graphic art industries, and does not have any particular restrictions on its kind and properties. However, the most general photosensitive material is a contrast photosensitive material such as a so-called lith film.

Therefore, silver halides which can be used in light-sensitive silver halide emulsion layers for the photosensitive material of the present invention are not restricted to any special ones, and include silver chlorobromide, silver chloroiodobromide, silver iodobromide, silver bromide and so on. However, silver chlorobromide or silver chloroiodobromide in which at least 60 mole % (preferably 75 mole % or more) of silver chloride and 0 to 5 mole % of silver iodide are contained is employed to greater advantage. Silver halide grains do not have any particular restrictions on their shape, crystal habit, size distribution and so on. However, they are desired to have grain sizes smaller than $0.7\mu$.

The sensitivity of a silver halide emulsion to be used in the present invention can be raised without coarsening grains by the use of gold compounds such as chloroaurates, gold trichloride, etc.; salts of noble metals such as rhodium, iridium, etc.; sulfur compounds capable of forming silver sulfate by reacting with silver salts; or reducing substances such as stannous salts, amines and so on.

In addition, in a step of allowing the produced silver halide grains to ripen physically, or forming nuclei of silver halide grains, salts of noble metals such as rhodium, iridium and the like, and iron compounds like hexacyanoferrates (III) may be present.

As for hydrophilic colloidal binders to be used in the present invention, gelatin is of greater advantage. Of course, hydrophilic colloids other than gelatin may be also employed.

Suitable examples of such hydrophilic colloids include proteins such as gelatin derivatives, graft polymers obtained by graft polymerization of gelatin and other high polymers; proteins such as albumin, casein, etc.; cellulose derivatives such as hydroxyethyl cellulose, carboxymethyl cellulose, cellulose sulfate, etc.; sodium alginate; and various kinds of synthetic hydrophilic macromolecular substances such as homo- or co-polymers including polyvinyl alcohol, partially acetalated polyvinyl alcohol, poly-N-vinylpyrrolidone, polyacrylic acid, polymethacrylic acid, polyacrylamide, polyvinylimidazole, polyvinylpyrazole and so on.

Among these hydrophilic colloids, gelatins are especially favorable.

As for gelatins, not only lime-processed gelatin but also acid-processed gelatin and enzyme-processed gelatin as described in *Bull. Soc. Sci. Phot. Japan*, No. 16, p. 30 (1966) may be used. In addition, hydrolysis products and enzymatic degradation products also can be employed.

The silver halide emulsion layers and other hydrophilic colloidal layers can contain polymer latexes made up of homo or co-polymers containing as their constitutional repeating units alkylacrylates, alkylmethacrylates, acrylic acid, glycidylacrylate or/and so on, as described in U.S. Pat. Nos. 3,411,911; 3,411,912; 3,142,568; 3,325,286 and 3,547,650; published examined Japanese Patent Application No. 5331/70: and so on, for the purposes of improvements in the dimentional stability and the physical properties of coated films, and so on.

The photographic emulsions to be employed in the present invention can be subjected to orthochromatic or panchromatic spectral sensitization or supersensitization by the independent or combined use of cyanine dyes including cyanines, merocyanines, carbocyanines and the like, or by the combined use of cyanine dyes and styryl dyes or so on.

For effecting the above-described sensitizations, sensitizing dyes described in Japanese Patent Application Nos. 20623/75 and 93833/75, and U.S. Pat. No. 3,567,458 are especially advantageous.

The photographic emulsions can contain antifoggants, with specific examples including various kinds of heterocyclic compounds such as 4-hydroxy-6-methyl-1,3,1, 3a,7-tetrazaindene, 3-methylbenzothiazole, 1-phenyl-5mercaptotetrazole, etc.; mercury-containing compounds; mercapto compounds; and further, antifoggants well-known in the art, as described in published unexamined Japanese Patent Applications Nos. 81024/74, 6306/75 and 19429/75; and U.S. Pat. No. 3,850,639.

Surface active agents can be added to the silver halide emulsions as a coating aid, and for the purposes of improvement in the photographic characteristics, and so on.

Examples of suitable surface active agents include natural surface active agents such as saponin; nonionic surface active agents of the alkyleneoxide type, glycidol type and so on; anionic surface active agents containing acid groups such as carboxylic acid group, a sulfonic acid group (e.g., surface active agents described in U.S. Pat. No. 3,415,649), a phosphoric acid group, a sulfate group, a phosphate group, etc.; and amphoteric surface active agents of the amino acid type, the aminosulfonic acid type, the sulfates or phosphates of aminoalcohols and so on.

Examples of polyalkyleneoxide compounds to be employed in the present invention include products obtained by the condensation reactioh of polyalkyleneoxides having at least 10 units of alkyleneoxide containing 2 to 4 carbon atoms, e.g., ethylene oxide, propylene-1,2-oxide, butylene-1,2-oxide, etc., especially ethylene oxide; with compounds containing at least one active hydrogen atom, e.g., water, aliphatic alcohols, aromatic alcohols, fatty acids, organic amines, hexitol derivatives, etc.; and block copolymers of two or more kinds of polyalkyleneoxides. More specifically, polyalkylene glycols, polyalkylene glycol alkyl ethers, polyalkylene glycol aryl ethers, polyalkylene glycol (alkyl aryl) esters, polyalkylene glycol esters, polyalkylene glycol fatty acid amides, polyalkylene glycol amines, polyalkylene glycol block copolymers, polyalkylene glycol grafted polymers and so on can be used as such polyalkyleneoxide compounds.

Specific examples of the polyalkyleneoxide compounds which can be advantageously used in the present invention are illustrated below.

1. $HO(CH_2CH_2O)_9H$
2. $C_{12}H_{25}O(CH_2CH_2O)_{15}H$
3. $C_8H_{17}CH{=}CHC_8H_{16}O(CH_2CH_2O)_{15}H$

4. 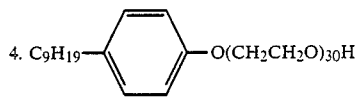

5. $C_{11}H_{23}COO(CH_2CH_2O)_{80}H$
6. $C_{11}H_{23}CONH(CH_2CH_2O)_{15}H$

7. 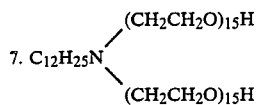

8. $C_{14}H_{29}N(CH_2)(CH_2CH_2O)_{24}H$

9. 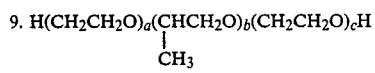

$$a + b + c = 50$$
$$b{:}a + c = 10{:}9$$

A preferable ratio of an amount of silver halide to that of a hydrophilic colloidal binder in the silver halide emulsion layer of the present invention is ½ or below by weight.

The silver halide emulsion layer of the present invention may be single, or include two or more layers.

For example, in case that the silver halide emulsion layer has two constituent layers, it is desirable for the ratio of the total content of silver halides in the two constituent layers to that of the hydrophilic colloidal polymers therein to be controlled to ½ or below by weight and that, the upper light-sensitive emulsion layer contain a larger amount of hydrophilic colloidal binder than the lower emulsion layer.

In addition, a preferred coverage of silver halide ranges from 1.0 to 6.0 g/m$^2$, particularly from 1.5 to 4.0 g/m$^2$, calculated on the basis of silver.

The present invention produces a particularly great effect when the silver coverage is small, especially not more than 4 g/m$^2$ calculated on the basis of silver.

The light-insensitive upper layer of the present invention can contain, in addition to a hydrophilic colloidal binder as described above (e.g., gelatin), a surface active agent, an antistatic agent, a matting agent, a slipping agent, colloidal silica, a gelatin plasticizer, a polymer latex (e.g., one which described in Japanese Patent Application No. 142464/82) and so on.

Suitable matting agents are polymethylmethacrylate grains and silicon dioxide grains, which have a size of 0.1 to 10 μ, particularly 1 to 5μ.

Suitable examples of a support to be employed for the process photosensitive material of the present invention include polyester films like a polyethylene terephthalate film, and cellulose ester films like a cellulose triacetate film.

The exposure for obtaining a photographic image in the present invention may be carried out in a conventional manner. Any various known light sources including natural light (sun light), a tungsten lamp, a fluorescent lamp, a mercury lamp, a xenon arc lamp, a carbon arc lamp, a xenon flash lamp, cathode-ray tube flying spot and so on can be employed for the exposure. Suitable exposure times which can be used include not only exposure times commonly used in cameras ranging from about 1/1000 to about 1 sec., but also exposure times shorter than 1/1000 sec., for example, about $1/10^4$ to about $1/10^6$ sec. as used with xenon flash lamps and cathode-ray tubes. Exposure times longer than 1 second can also be used. The spectral distribution of the light employed for the exposure can be controlled using color filters, if desired. Laser beams can be also employed for the exposure.

The process photosensitive material of the present invention does not have any particular restrictions on its development-processing method. Any developing methods which have been generally employed for conventional process photosensitive materials can be employed for the present invention. Suitable processing temperatures are generally chosen from the range of 18° C. to 50° C. However, processing temperatures lower than 18° C. or those higher than 50° C. may also be employed.

Developing solutions which can be used in the present invention can contain known developing agents. Dihydroxybenzenes (e.g., hydroquinone), 3-pyrazolidones (e.g., 1-phenyl-3-pyrazolidone), aminophenols (e.g., N-methyl-p-aminophenol), 1-phenyl-3-pyrazolines, ascorbic acid, heterocyclic compounds such as those obtained by condensing 1,2,3,4-tetrahydroquinoline rings and indolene rings, which are described in U.S. Pat. No. 4, 067,872; and so on can be used as a developing agent individually or in combination thereof. In addition to such a developing agent, the developing solution contains a known preservative, an alkali agent, a pH buffer agent and an antifogging agent. Further, it may contain a dissolving aid, a color toning agent, a development accelerator, a surface active agent, a defoaming agent, a water softener, a hardener, a viscosity providing agent and so on, if desired.

A so-called lithographic developing solution is particularly favorably employed in the present invention. A lithographic developing solution is basically composed of an orthor para-dihydroxybenzene, an alkali agent, a small amount of free sulfite, a sulfite ion buffer and so on. The ortho- or para-dihydroxybenzene to function as a developing agent can be properly chosen from those well-known in the photographic art. Specific examples of such dihydroxybenzenes include hydroquinone, chlorohydroquinone, bromohydroquinone, isopropylhydroquinone, toluhydroquinone, methylhydroquinone, 2,3-dichlorohydroquinone, 2,5-dimethylhydroquinone and the like.

Among these hydroquinones, hydroquinone is most suitable for practical use. These developing agents are used singly or in combination. A suitable amount of the developing agent to be added ranges from 1 to 100 g, preferably 5 to 80 g, per one liter of the developing solution. A sulfite ion buffer is used in such an amount that concentration of sulfite may be effectively maintained at an approximately constant value in the developing solution. Examples of such buffers are an aldehyde-alkali metal hydrogen sulfite addition product such as formaline-sodium hydrogen sulfite addition product, a ketone-alkali metal hydrogen sulfite addition product such as acetone-sodium hydrogen sulfite addition product, and a carbonylbisulfite-amine condensation product such as sodium bis(2-hydroxyethyl)aminomethane sulfonate. The amount of the sulfite ion buffer which is added can range from about 13 to 130 g per one liter of the developing solution.

In the developing solution which can be employed in the present invention, the concentration of free sulfite ions can be controlled by the addition of an alkali metal sulfite such as sodium sulfite. The amount of the alkali metal sulfite added is generally not more than 5 g, particularly preferably not more than 3 g, per one liter of the developing solution. Of course, addition amounts more than 5 g may be employed.

In many cases, it is preferable to include a development controlling agent conprised of alkali halides, especially alkali bromides such as sodium bromide, potassium bromide and the like. The alkali halide is added in an amount of preferably 0.01 to 10 g, particularly 0.1 to 5 g, per one liter of the developing solution.

An alkali agent is added to adjust the developing solution to an alkaline condition preferably to a pH higher than 9 (more preferably to a pH of 9.7 to 11.5). Sodium carbonate or potassium carbonate is used as the alkali agent in a usual developing solution, and the addition amount thereof can be freely selected, provided that the above-described pH range is attained.

Fixing solutions which can be used in the present invention include those having generally used compositions.

Fixing agents which can be contained therein include not only thiosulfates and thiocyanates but also organic sulfur-containing compounds which are known to function as a fixing agent.

The fixing solution may contain water soluble aluminium salts as a hardener.

Formation of color images can be carried out using conventional methods.

The development-processing may be carried out by handwork or using an automatic developing machine. When the processing is carried out using an automatic developing machine, any conveying techniques (e.g., roller conveyance, belt conveyance, etc.) can be employed. Therefore, conventionally used conveyance type automatic developing machines can be used. In addition, for details of compositions of processing solutions and developing methods which can be used descriptions in U.S. Pat. Nos. 3,025,779; 3,078,024; 3,122,086; 3,149,551; 3,156,173; 3,224,356; 3,573,914; and so on can be referred to.

Further, for details of silver halide emulsion layers, other layers, supporting materials, processing methods and so on which can be employed in the process photosensitive material of the present invention descriptions in *Research Disclosure*, vol. 176, pp. 22 to 28 (Dec., 1978) can be referred to.

Reducing solutions which can be employed in the present invention are not limited to particular ones. For example, those described in C. E. K. Mees, supra can be effectively used.

Specifically, a reducing solution in which a permanganate, a persulfate, a ferric salt, a cupric salt, a ceric salt, a hexacyanoferrate (III), a dichromate and so on are contained singly or in combination and optionally, an inorganic acid like sulfuric acid, and an alcohol may be incorporated; or a reducing solution in which a reducing component such as a hexacyanoferrate (III) or an ethylenediaminetetraacetatoferrate (III), a silver halide solvent such as a rhodanate, thiourea or its derivative, or so on and optionally, an inorganic acid like sulfuric acid are contained can be employed in the present invention.

The reducing solution to be employed in the present invention can further contain a mercapto group-containing compound as described in published unexamined Japanese Patent Application No. 68419/77, if desired.

The reducing solutions which can be employed in the reduction processing of the present invention do not have any particular restrictions on their compositions and processing conditions (temperature, time, etc.). Therefore, they can be determined properly by one skilled in the art.

For details of the reducing solution and the reducing process descriptions in C. E. K. Mees, *The Theory of the Photographic Process*, pp. 738–739, Macmillan, New York (1954) and published unexamined Japanese Patent Application Nos. 140733/76, 68419/77, 14901/78, 119236/79, 119237/79, 2245/80, 2244/80, 17123/80, 79444/80 and 81344/80 can be referred to.

The present invention will no be illustrated in more detail by reference to the following examples. However, the scope of the invention is not limited to these examples.

EXAMPLE 1

A silver halide emulsion composed of 80 mole % of silver chloride, 19.5 mole % of silver bromide and 0.5 mole of silver iodide was subjected to gold sensitization and sulfur sensitization in conventional manners. This emulsion contained gelatin in a proportion of 45 wt % to the silver halide. To this emulsion were added 3-carboxymethyl-5-[2-(3-ethyl-thiazolinylidene)ethylidene]rhodanine (spectral sensitizer), 4-hydroxy-1,3,3a,7-tetrazaindene (stabilizer), polyoxyethylene nonyl phenyl ether containing 50 ethylene oxide moieties, and the same polymer latex as described in Synthetic Example 3 of U.S. Pat. No. 3,525,620. Thereafter, 1,2-bis(vinylsulfonylacetoamido)ethane (hardener) was added to the resulting emulsion in such an amount that the proportion thereof to the whole dried gelatin (that is, involving gelatin contained in the light-insensitive upper layer described hereinafter) may come to be 2.6 wt %. Further to the resulting emulsion, one of the compounds of the present invention was so added as described in Table 1 to prepare a coating composition for a light-sensitive silver halide emulsion layer.

On the other hand, a coating composition for a light-insensitive upper layer was, in parallel with the above-described preparation, prepared by adding to a 5% gelatin solution the same polymer latex as described above, sodium dodecylbenzenesulfonate (surface active agent) and a polymethylmethacrylate latex having a mean particle size of 3.0 to 4.0μ and then, further adding the polymeric hardener P-2 in such an amount as described in Table 1 to the resulting gelatin solution.

Both the above-described coating compositions for a light-sensitive silver halide emulsion layer and for a light-insensitive upper layer respectively were coated on a polyethylene terephthalate support using the double layer simultaneous coating process. Therein, the coverage of silver was 3.0 g/m$^2$, and the dry thickness of the light-insensitive upper layer was 1.0μ.

In each of the thus produced samples, a halftone image was formed as follows: A commercially available gray contact screen for negative (150 line/inch) was allowed to closely contact with the sample, and exposed to white tungsten light for 10 seconds through a step wedge having a difference in density level of 0.1. Thereafter, the sample was processed using the following developing solution at 27° C. for 100 seconds and subsequently, fixed, washed with water, and dried in the conventional manners.

| Composition of Developing Solution: | |
|---|---|
| Sodium Carbonate (monohydrate) | 50 g |
| Formaldehyde-hydrogen sulfite Adduct | 45 g |
| Potassium Bromide | 2 g |
| Hydroquinone | 18 g |
| Sodium Sulfite | 2 g |
| Water to make | 1 l |

The thus obtained halftone strips were dipped in the following cerium type reducing solution (at 20° C.), and washed with water.

| Composition of Reducing Solution: | |
|---|---|
| Ceric Sulfate | 25 g |
| Concentrated Sulfuric Acid | 30 g |
| Water to make | 1 l |

Changes in dot areas and in per dot densities of the thus processed halftone strips were measured with a microdensitometer. Therein, attention was given to dots having a dot area of 50%, the dot area which these dots had when the per dot density thereof was lowered to 2.5 by the reduction processing was measured, and the difference between these dot areas was employed as a reduction width.

In addition, melting times of the light-insensitive upper layer and the light-sensitive silver halide emulsion layer of each sample were determined by the aforementioned process, and swelling degrees of the samples were measured in water at a room temperature. Results of such measurements are also summarized in Table 1.

TABLE 1

| Sample No. | Additive in Emulsion Layer Compound Name | Amount Added (g/m2) | Polymeric Hardener in Upper Layer | Before Reduction Dot Area | Before Reduction Dot Density | Dot Area After Such Reduction as to reduce D to 2.5 | Reduction Width | Reduction Time | Swelling (room temp.) | Melting Time Light-insensitive Upper Layer | Melting Time Silver Halide Emulsion Layer | Remark |
|---|---|---|---|---|---|---|---|---|---|---|---|---|
| 1 | — | — | — | 50% | 4.0 or more | 40.5% | 9.5% | 47 sec. | 4.6μ | 760 sec. | 760 sec. | Blank |
| 2 | Hydroxypropyl Starch | 0.48 | — | 50% | 4.0 or more | 41.0 | 9.0 | 49 | 5.4 | 755 | 725 | Comparison |
| 3 | Hydroxypropyl Starch | 0.96 | — | 50% | 4.0 or more | 40.0 | 9.4 | 55 | 6.6 | 760 | 680 | Comparison |
| 4 | — | — | P-2(80 mg/m$^2$) | 50% | 4.0 or more | 39.0 | 11.0 | 67 | 3.6 | 1260 | 820 | Comparison |
| 5 | Hydroxy- | 0.48 | P-2(80 | 50% | 4.0 or | 37.8 | 12.2 | 67 | 4.9 | 1255 | 830 | This Invention |

TABLE 1-continued

| Sample No. | Additive in Emulsion Layer Compound Name | Additive in Emulsion Layer Amount Added (g/m2) | Polymeric Hardener in Upper Layer | Before Reduction Dot Area | Before Reduction Dot Density | Dot Area After Such Reduction as to reduce D to 2.5 | Reduction Width | Reduction Time | Swelling (room temp.) | Melting Time Light-insensitive Upper Layer | Melting Time Silver Halide Emulsion Layer | Remark |
|---|---|---|---|---|---|---|---|---|---|---|---|---|
| | propyl Starch | | mg/m$^2$) | | more | | | | | | | |
| 6 | Hydroxy-propyl Starch | 0.96 | P-2(80 mg/m$^2$) | 50% | 4.0 or more | 38.0 | 12.0 | 68 | 6.0 | 1230 | 780 | This Invention |
| 7 | Soluble Starch | 0.48 | P-2(80 mg/m$^2$) | 50% | 4.0 or more | 38.1 | 11.9 | 65 | 5.0 | 1250 | 815 | This Invention |
| 8 | Soluble Starch | 0.96 | P-2(80 mg/m$^2$) | 50% | 4.0 or more | 38.7 | 11.3 | 69 | 6.1 | 1240 | 790 | This Invention |
| 9 | Dextrin | 0.48 | P-2(80 mg/m$^2$) | 50% | 4.0 or more | 38.0 | 12.0 | 68 | 5.0 | 1265 | 820 | This Invention |
| 10 | Dextrin | 0.96 | P-2(80 mg/m$^2$) | 50% | 4.0 or more | 38.4 | 11.6 | 65 | 5.9 | 1245 | 780 | This Invention |
| 11 | Dextran | 0.48 | P-2(80 mg/m$^2$) | 50% | 4.0 or more | 38.1 | 11.9 | 66 | 4.9 | 1270 | 830 | This Invention |
| 12 | Dextran | 0.96 | P-2(80 mg/m$^2$) | 50% | 4.0 or more | 36.1 | 13.9 | 71 | 5.7 | 1250 | 740 | This Invention |
| 13 | Pullulan | 0.48 | P-2(80 mg/m$^2$) | 50% | 4.0 or more | 37.5 | 12.5 | 62 | 4.9 | 1240 | 790 | This Invention |
| 14 | Pullulan | 0.96 | P-2(80 mg/m$^2$) | 50% | 4.0 or more | 36.0 | 14.0 | 68 | 5.8 | 1210 | 840 | This Invention |

It has becomes apparent from the results in Table 1 that the present invention has the following effects. Firstly, the samples of the present invention Nos. 5 and 6 have greater reduction widths owing to incorporation of hydroxypropyl starch therein, compared with the comparative sample No. 4 which did not contain it. Secondly, the samples of the present invention Nos. 5 and 6 have lower swelling degrees, that is, greater film strengths even if hydroxypropyl starch was added in larger amounts than the comparative samples Nos. 2 and 3, and further, much greater reduction widths because the light-insensitive upper layers thereof were hardened to greater degrees than their emulsion layers, compared with the comparative samples Nos. 2 and 3 wherein the independent hardening of coated layers was not carried out. Thirdly, the above-described effects of the present invention can be achieved similarly by the use of soluble starch, dextrin, dextran or Pullulan (produced by Sumitomo Chemical Co., Ltd., PF grade, mean molecular weight: $7\times10^4$) and therefore, it is understandable that a wide range of starches including starch, modified starch and macromolecular polysaccharides produced from starch using a microbial fermentation process can contribute to attainment of the effects of the present invention.

According to further experiments in which polymers for replacing a part of gelatin thereby, other than the compounds of the present invention, such as poly-N-vinyllactams, poly-N-vinylpyrrolidone, cellulose derivatives, polyacrylic acid, polyacrylamide and polyvinyl alcohols respectively were employed in place of hydroxypropyl starch, it has turned out that increase in reduction width can hardly be expected since such polymers had poor compatibility with gelatin and therefore, the highest possible addition amounts of such polymers were less than the addition amount of hydroxypropyl starch in Sample No. 5 by a factor of several to several tens. Accordingly, the compounds of the present invention alone, (that is, starch, modified starch and macromolecular polysaccharides produced from starch using a microbial fermentation process) have proved to be specific for the effects of the present invention.

Furthermore, it has been found out that in the samples of the present invention Nos. 5 to 14, their halftone gradation between 5% dot and 95% dot was elongated by about 10%, compared with that of the comparative sample No. 4 and therefore, the samples of the present invention demonstrated more excellent characteristics as the process photosensitive material, compared with conventional ones.

EXAMPLE 2

Each of the same samples as produced in Example 1 was dipped in the following reducing solution (of Fe-EDTA type), washed with water, and dried.

Results of reduction are shown in Table 2.

| Composition of Reducing Solution: | |
|---|---|
| Sodium Ethylenediaminetetraacetonatoferrate (III) | 85 g |
| Thiourea | 65 g |
| Citric Acid | 60 g |
| Hydrochloric Acid (amount to make pH = 1.0) | |
| Water to make | 1 l |

TABLE 2

| | Fe—EDTA Reducing Solution | | |
|---|---|---|---|
| Sample No. | Reduction Width (%) | Reduction Time (sec) | Remark |
| 1 | 8.8 | 63 | Blank |
| 2 | 9.6 | 54 | Comparison |
| 3 | 9.9 | 55 | " |
| 4 | 11.0 | 80 | " |
| 5 | 12.1 | 78 | This Invention |
| 6 | 12.4 | 72 | " |
| 7 | 12.0 | 76 | " |
| 8 | 11.8 | 70 | " |
| 9 | 12.0 | 76 | " |
| 10 | 12.4 | 73 | " |
| 11 | 11.5 | 78 | " |
| 12 | 13.3 | 72 | " |
| 13 | 12.1 | 76 | " |
| 14 | 14.2 | 82 | " |

As can be seen from Table 2, the samples of the present invention showed remarkable improvement in its aptitude for reduction and exhibited stable reduction capacity upon the reduction processing with not only the cerium type reducing solution but also the Fe-EDTA type reducing solution and further, they have proper reduction times.

While the invention has been described in detail and with reference to specific embodiments thereof, it will be apparent to one skilled in the art that various changes and modifications can be made therein without departing from the spirit and scope thereof.

What is claimed is:

1. A silver halide photographic material for a photomechanical process, comprising:
   a support having thereon;
   a light-sensitive silver halide eumulsion layer; and
   a hydrophilic colloidal light-insensitive upper layer provided on the surface of the emulsion layer facing away from the support;
   the light insensitive upper layer containing and being hardened by a polymeric hardener having a repeating unit represented by the following formulae (I), (II), or (III),

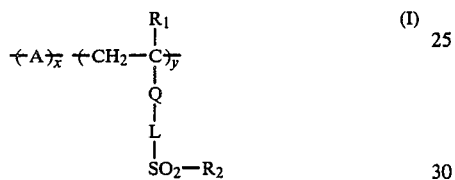

(I)

wherein A represents an ethylenic unsaturated monomer capable of copolymerizing with the monomer unit shown on its right side; Q represents $-CO_2-$,

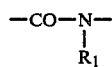

or an arylene group containing 6 to 10 carbon atoms; L represents a divalent group having 3 to 15 carbon atoms containing at least either $-CO_2-$ or

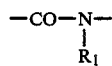

or a divalent group having 1 to 12 carbon atoms containing at least one bonding selected from a class consisting of $-O-$,

$-CO-$, $-SO-$, $-SO_3-$,

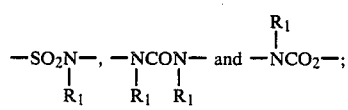

$R_1$ in formula (I), in Q, and in L independently represents a hydrogen atom or a lower alkyl group containing 1 to 6 carbon atoms; $R_2$ represents a vinyl group or a functional group corresponding to the precursor thereof, which have the formulae $-CH=CH_2$ and $-CH_2CH_2X$, respectively wherein X represents a group capable of being replaced by a nucleophilic group, or a group capable of being released by a base in a form of HX; and x and y each represent a mole % fraction, and x ranges from 0 to 99 and y ranges from 1 to 100;

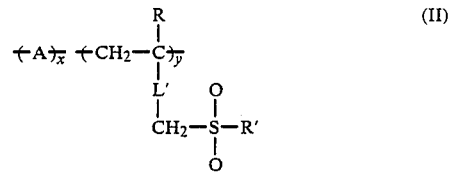

wherein A represents an ethylenic unsaturated monomer unit capable of undergoing copolymerization with the monomer unit shown on the right side thereof, or a mixture of such monomers; x and y each represents a mole fraction, and x ranges from 10 to 95% and y ranges from 5 to 90%, R represents a hydrogen atom, or an alkyl group containing 1 to 6 carbon atoms; R' represents $-CH=CH_2$, or $-CH_2CH_2X$, wherein X represents a group capable of being replaced by a nucleophilic group, or a group capable of being released by a base in a form of HX; and L' represents a linking group selected from alkylene groups, arylene groups containing 6 to 12 carbon atoms, $-COZ-$ or $-CPZR_3$, wherein $R_3$ represents alkylene containing 1 to 6 carbon atoms, or arylene containing 6 to 12 carbon atoms; and Z represents an oxygen atom or $-NH$;

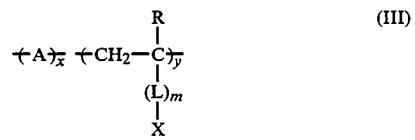

wherein A represents an ethylenic unsaturated monomer unit capable of copolymerizing with the monomer unit shown on the right side thereof; R represents a hydrogen atom, or an alkyl group containing 1 to 6 carbon atoms; L represents a divalent linking group containing 1 to 20 carbon atoms; X represents an active ester group; x and y each represents a mole % fraction, and x ranges from 0 to 95 and y ranges from 5 to 100; and m is 0 to 1;

and wherein the light-insensitive upper layer has a melting time greater than the melting time of the silver halide emulsion layer, and the emulsion contains a hydrophilic colloidal binder comprising gelatin and the at least one additive selected from the group consisting of starch, modified starch and macromolecular polysaccharide produced from starch using a microbial fermentation process.

2. A method for reduction of a silver halide photographic material for a photomechanical process, comprising the steps of:
   image wise exposing a material comprised of a support having thereon a light-sensitive silver halide emulsion layer and a hydrophilic colloidal light-insensitive upper layer provided on the surface of the emulsion layer facing away from the support, the light-insensitive upper layer having a melting time greater than the melting time of the emulsion layer and the emulsion layer containing a hydrophilic colloidal binder comprising gelatin and at least one additive selected from the group consisting of starch, modified starch and macromolecular polysaccharides produced from starch using a microbial fermentation process;

development processing the material; and reduction processing the silver image thus obtained.

3. A silver halide photographic material as claimed in claim 1, wherein the additive is a modified starch selected from the group consisting of starch derivatives, hydrolysis products of starch and derivatives of hydrolysis products of starch.

4. A silver halide photographic material as claimed in claim 1, wherein the silver halide emulsion layer is comprised of silver halide particles dispersed in a hydrophilic colloidal binder and wherein the additive is present in the emulsion layer in an amount of 0.01 to 1 part by weight based on the weight of the hydrophilic colloidal binder.

5. A silver halide photographic material as claimed in claim 4, wherein the additive is present in an amount in the range of 0.1 to 0.6 part by weight based on the weight of the hydrophilic colloidal binder.

6. A silver halide photographic material as claimed in claim 1, wherein the additive is present in an amount in the range of 0.01 to 3.0 g/m².

7. A silver halide photographic material as claimed in claim 6, wherein the additive is present in an amount in the range of 0.05 to 1.0 g/m².

8. A silver halide photographic material as claimed in claim 1, wherein the light-insensitive upper layer contains a polymeric hardener having the general formula (I).

9. A silver halide photographic material as claimed in claim 1, wherein the melting time of at least one light-insensitive upper layer is greater than that of silver halide emulsion layer by 50 seconds or more, based on a measurement which is carried out in 0.2N NaOH solution kept at 75° C.

10. A silver halide photographic material according to claim 1, wherein L' is an alkylene group containing 1 to 6 carbon atoms.

11. The method according to claim 2, wherein the additive is a modified starch selected from the groups consisting of starch derivatives, hydrolysis products of starch and derivatives of hydrolysis products of starch.

12. The method according to claim 2, wherein the silver halide emulsion layer is comprised of silver halide particles dispersed in a hydrophilic colloidal binder and wherein the additive is present in the emulsion layer in an amount of 0.01 to 1 part by weight based on the weight of the hydrophilic colloidal binder.

13. The method according to claim 12, wherein the additive is present in an amount in the range of 0.1 to 0.6 part by weight based on the weight of the hydrophilic colloidal binder.

14. The method according to claim 2, wherein the additive is present in an amount in the range of 0.01 to 3.0 g/m².

15. The method according to claim 14, wherein the additive is present in an amount in the range of 0.05 to 1.0 g/m².

16. The method according to claim 2, wherein the light-insensitive upper layer contains a polymeric hardener having the general formula (I)

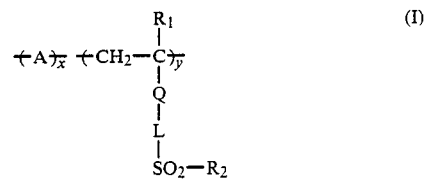

wherein A represents an ethylenic unsaturated monomer capable of copolymerizing with the monomer unit shown on its right side; Q represents —CO$_2$—,

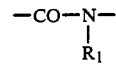

or an arylene group containing 6 to 10 carbon atoms; L represents a divalent group having 3 to 15 carbon atoms containing at least either —CO$_2$ or

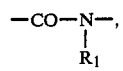

or a divalent group having 1 to 12 carbon atoms containing at least one bonding selected from a class consisting of —O—,

—CO—, —SO— —SO$_2$—, —SO$_3$—,

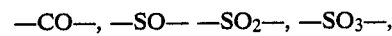

R$_1$ in formula (I), in Q, and in L independently represents a hydrogen atom or a lower alkyl group containing 1 to 6 carbon atoms; R$_2$ represents a vinyl group of a functional group corresponding to the precursor thereof, which have the formulae —CH=CH$_2$ and —CH$_2$CH$_2$X, respectively, wherein X represents a group capable of being replaced by a nucleophilic group, or a group capable of being released by a base in the form of HX; and x and y each represents a mole % fraction, and x ranges from 0 to 99 and y ranges from 1 to 100;

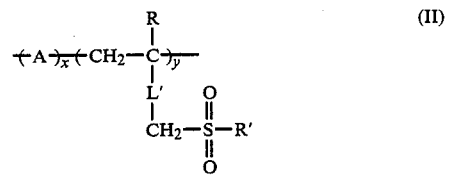

wherein A represents an ethylenic unsaturated monomer unit capable of undergoing copolymerization with the monomer unit shown on the right side thereof, or a mixture of such monomers; x and y each represents a mole fraction, and x ranges from 10 to 95% and y ranges from 5 to 90%, R represents a hydrogen atom, or an alkyl group containing 1 to 6 carbon atoms; R' represents —CH=CH$_2$, or —CH$_2$CH$_2$X, wherein X represents a group capable of being replaced by a nucleophilic group, or a group capable of being released by a base in the form of HX; and L' represents a linking group selected from alkylene groups, arylene groups containing 6 to 12 carbon atoms, —COZ— or —COZR$_3$, wherein R$_3$ represents alkylene containing 1 to 6 carbon atoms, or arylene containing 6 to 12 carbon atoms; and Z represents an oxygen atom or —NH;

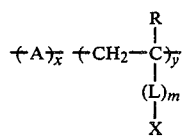
(III)

wherein A represents an ethylenic unsaturated monomer unit capable of copolymerizing with the monomer unit shown on the right side thereof; R represents a hydrogen atom, or an alkyl group containing 1 to 6 carbon atoms; L represents a divalent linking group containing 1 to 20 carbon atoms; X represents an active ester group; x and y each represents a mole % fraction, and x ranges from 0 to 95 and y ranges from 5 to 100; and m is 0 or 1;

so that the light-insensitive upper layer has a melting time greater than the melting time of the silver halide emulsion layer, and the emulsion containing at least one additive selected from the group consisting of starch, modified starch and macromolecular polysaccharide produced from starch using a microbial fermentation process.

17. The method according to claim 16, wherein L' is an alkylene group containing 1 to 6 carbon atoms.

18. The method according to claim 16, wherein the light-insensitive upper layer contains a polymeric hardener having the general formula (I).

19. The method according to claim 2, wherein the melting time of at least one light-insensitive upper layer is greater than that of the silver halide emulsion layer by 50 seconds or more based on a measurement which is carried out in 0 2N NaOH solution kept at 75° C.

20. A silver halide photographic material according to claim 1, wherein the polymeric hardener has a repeating unit represented by formula (I).

* * * * *